United States Patent [19]
Kalb, Jr.

[11] Patent Number: 5,627,789
[45] Date of Patent: May 6, 1997

[54] SENSE AMPLIFIER CIRCUITRY FOR DIFFERENTIAL SEMICONDUCTOR MEMORIES

[75] Inventor: Jeffrey C. Kalb, Jr., Phoenix, Ariz.

[73] Assignee: Intel Corporation, Santa Clara, Calif.

[21] Appl. No.: 579,299

[22] Filed: Dec. 27, 1995

[51] Int. Cl.$^6$ ............................................. G11C 7/00
[52] U.S. Cl. ................................... 365/205; 365/210
[58] Field of Search ............................ 365/205, 210; 327/57, 51

[56] References Cited

U.S. PATENT DOCUMENTS

| | | | |
|---|---|---|---|
| 5,023,841 | 6/1991 | Akrout et al. | 365/205 |
| 5,042,011 | 8/1991 | Casper et al. | 327/51 |
| 5,053,998 | 10/1991 | Kannan et al. | 365/205 |
| 5,247,479 | 9/1993 | Young | 365/205 |
| 5,311,469 | 5/1994 | Hoshi et al. | 365/205 |
| 5,325,335 | 6/1994 | Ang et al. | 365/205 |

*Primary Examiner*—David C. Nelms
*Assistant Examiner*—Michael T. Tran
*Attorney, Agent, or Firm*—Blakely, Sokoloff, Taylor & Zafman

[57] ABSTRACT

A differential voltage memory apparatus is provided which includes one or more preliminary stages of differential amplifiers which operate prior to triggering of a final stage of differential amplifiers. The preliminary stages of differential amplifiers include cross-coupled inverters that are closely coupled to bit lines connected to memory cells of the memory apparatus. The final stage of sense amplifiers include cross-coupled inverters which are, in use, substantially decoupled from the bit lines of the memory cells. The preliminary sense amplifiers are activated shortly after activation of corresponding memory cells and provide an initial stage of amplification of a voltage differential generated by the memory cells. The final stage sense amplifiers are triggered after a suitable time delay guaranteeing that a sufficient minimum voltage differential has been generated. The preliminary sense amplifier stages, which are closely coupled to the bit lines and are thereby subject to heavy capacitive loading, provide an initial stage of amplification which is substantially immune from noise effects, such as effects caused by alpha strikes and the like. The final stage of sense amplifiers, which are substantially decoupled from the capacitive bit lines, coupled to quickly amplify the voltage differential to opposing rail voltages. The method and apparatus embodiments are described.

7 Claims, 7 Drawing Sheets

SENSE AMPLIFIER CIRCUITRY FOR DIFFERENTIAL SEMICONDUCTOR MEMORIES

BACKGROUND OF THE INVENTION

1. Field of the Invention

The invention generally relates to the field of integrated circuit devices. More particularly, the invention relates to a memory device in which a memory read operation is accomplished by comparing two differential voltage signals provided by a column of memory cells.

2. Description of Related Art

Typical semiconductor memories include an array of memory cells arranged in columns and rows. Each column includes a set of memory cells connected to a node called a bit line, or possibly to several bit lines. Each row includes a set of memory cells connected to a common node called a word line, or possibly to several word lines. Each memory cell is associated with a unique combination of a word line and a bit line. Enablement of a row by a word line connects each memory cell in that row to its respective bit line or bit lines allowing data stored therein to be read or output. In state of the art devices, there are typically a large number of memory cells coupled to the bit line or lines of each column. Accordingly, the capacitance which the memory cell must drive is large and the bit lines charge and discharge slowly. Designers typically compensate for this inherent slowness by providing sense amplifiers for sensing small changes on the bit line or bit lines and amplifying the small changes into useful signals.

One broad class of such memories includes an array in which each column of cells is connected to two bit lines. Data is read from the memory as a differential voltage that is driven onto the bit lines by a selected memory cell. The differential voltage is amplified by a sense amplifier to levels which represent the logic value 1 or the logic value 0. The amplified voltage signals are then employed to perform logical functions using digital logic circuits. The differential nature of the voltage sensing and amplification achieves reduced access time and immunity from external sources of noise via common mode rejection. Thus, the use of a differential memory cell connected to a pair of bit lines allows faster read operations than a "single-ended" memory cell which is connected only to a single bit line.

Such memories are generally implemented either in N-Channel Metal Oxide Semiconductor (NMOS), Complementary Metal Oxide Semiconductor (CMOS) or Bipolar—CMOS (BiCMOS) integrated circuits. With these technologies, entire memories are placed on a single integrated circuit either alone or in combination with other digital or analog devices. Cost savings in material and in device interconnection labor is achieved. Moreover, integration on a single substrate guarantees a high degree of device matching which is necessary for manufacture of reliable differential components. However, a differential memory cell requires additional silicon die area than a single-ended memory cell, such as the single transistor, single capacitor Dynamic Random Access Memory (DRAM) cell. Nevertheless, the speed and noise immunity advantages gained by the differential memory cell typically compensate for the increased consumption of silicon die area.

Thus, a differential memory allows data to be read faster than a single-ended memory. Various techniques have been developed for sensing the differential voltage and amplifying the voltage. One simple method uses a CMOS inverter connected to either of the bit lines to generate a full rail swing on the output. This technique is limited to differential memories with very few rows. In larger memories having many rows, a significant bit line capacitance loads the bit lines. The significant bit line capacitance prevents the CMOS inverter from generating a full rail swing on the output promptly. An improved method for large arrays uses a differential amplifier or several stages of static differential amplifiers to generate a larger useful signal from the small bit line differential. The principal disadvantages of this technique are that each amplifier consumes direct current to operate and requires significant effort for proper design and characterization over all conditions of temperature, voltage, and manufacturing variability. Design improvements have helped to reduce these difficulties but, in substantial part, the difficulties remain.

For synchronous differential memories which are enabled by an externally provided clock edge, a more simple and elegant technique has prevailed. A read cycle begins by enabling a selected word line which interconnects all memory cells of one row. Each memory cell is configured such that one of the two bit lines in each column will begin to discharge, while the other remains at a precharge voltage, usually the high voltage rail. When a sufficient voltage differential is generated between the two bit lines, the sense amplifier samples the differential and rapidly amplifies the differential to yield a signal defined by two outputs with one output at ground and the other at a high voltage rail, such sense amplifiers are referred to as regenerative or dynamic sense amplifiers in common industry usage, but are herein referred to as delay-triggered sense amplifiers.

A minimum differential must be developed on the bit lines before the sense amplifier can reliably amplify it. In other words, a suitable "margin" must be developed within the differential signals before the sense amplifier can reliably amplify the differential. The amount of any necessary margin is defined by physical asymmetries in the circuits, noise couplings and sensitivity to alpha particle strikes. Alpha particle strikes, for example, can cause a reversal in the voltage differential such that, when the reversed differential is amplified, the original polarity of the differential is lost resulting in the output of erroneous data. A sufficient margin substantially guarantees that such an event will not occur.

To allow a necessary voltage differential to be developed on the bit lines before the sense amplifier samples and amplifies the differential, activation of the sense amplifier is typically delayed. In other words, the sense amplifier is not activated simultaneously with the memory cells. Rather, the sense amplifiers are activated sometime after the memory cells are activated, thereby allowing the memory cells to generate a sufficient voltage differential across the bit lines. In some differential memory devices, a simple inverter delay chain, or equivalent, is provided to delay activation of the sense amplifier following the activation of the memory cells by a read enable signal. However, circuits of the inverter delay chain will behave differently from the circuits of the memory cells under different conditions of temperature, supply voltage, and manufacturing variability, causing reliability issues which in turn require guardbanding and a corresponding slower access speed. In other words, the actual bit line differential caused by the inverter delay chain may differ from circuit to circuit. To ensure that a sufficient amount of delay is provided under all conditions to thereby ensure a sufficient voltage differential margin, the time delay is typically increased beyond the minimum delay that would otherwise be necessary, thereby yielding overall slower access of data from the memory circuit. As an alternative to inverter delay chains, some memory circuits employ a dummy word line which load is matched to circuits of the memory cells. The signal routed to the dummy word line is then employed as a sense amplifier enable signal for triggering operation of the sense amplifiers. With this arrangement, any process or temperature variation in the time delay of a signal transmitted through the dummy word line will also match the variation of the corresponding time delay of the signals routed through the memory cells. Hence, no significant difference in bit line differential will occur due to word line delay regardless of differences in temperature, voltage or manufacturing process. In some memory circuits, the sense amplifier enable signal is also routed through a dummy bit line for improved matching characteristics.

Although the use of the dummy word lines or dummy bit lines helps eliminate the need to increase the delay time beyond the minimum amount necessary, it would be helpful to further reduce the minimum delay time as well.

An example of differential memory of the type described above is illustrated in FIG. 1. More specifically, FIG. 1 illustrates a memory device 10 having a memory array 12, a row decoder 14, a column decoder 16 and a sense amplifier 18. Array 12 includes an array of individual SRAM memory cells 20. In use, a row selection signal is received and decoded by row decoder 14 which outputs a word line signal on one of a set of word lines 22 connected to all memory cells of the corresponding row of array 12. The word line signal causes each cell of the row to begin to output the binary value stored therein as a differential voltage signal along a pair of differential bit lines 24 and 26 interconnecting each column of memory cells. In this particular example, each pair of bit lines 24 and 26 are connected to a corresponding sense amplifier 30 within sense amplifier array 18. However, this is not the generate case since several columns may be multiplexed into a single sense amplifier via column selects. As noted above, the sense amplifiers are not immediately activated. Rather, the sense amplifiers are triggered by a sense amplifier enable signal 36 provided by a delay unit 32. Delay unit 32 receives a word line enable 34 from row decoder 14 at the same time the memory cells received the word line signal. The delay unit outputs the delayed word line enable signal as a sense amplifier enable signal 36 to the sense amplifiers 30. As noted above, the delay in triggering operation of the sense amplifiers is provided to ensure that the memory cells have sufficient time to establish a minimum voltage differential before the sense amplifiers begin to operate. This helps prevent the sense amplifiers from sensing and amplifying an erroneous differential, perhaps caused by an alpha particle strike or other noise source, and thereby helps prevent reading incorrect data. Although not separately shown in FIG. 1, delay unit 32 may include a dummy word line having a set of dummy memory cells whose loads are physically matched to the cells of array 12 to minimize any time delay skew that may occur as a result of temperature, manufacturing or process variations.

Thus, sense amplifiers 30 are not activated until a sense amplifier enable signal is received along line 36. Furthermore, the column decoder 16 will, in the general case, select one of several bit line pairs which is to be multiplexed into the sense amplifier. In this manner, one may choose to output only a subset of the logical values stored in each word line. To this end, the column decoder receives one or more column selection signals. These selection signals activate pass gates which permit the differential voltage on one bit line pair to pass into the sense amplifier. Only one pair of pass gates will be activated by their selection signal for each sense amplifier in question. All other selection signals will remain unasserted. FIG. 1 shows the case in which two bit line pairs are multiplexed into a single sense amplifier. A set of bit pair select lines 37 selects one pair of bit lines within each sense amplifier. If one desires to read N logical values from the array 12 in a given read cycle, then N sense amplifiers are required. A separate sense amplifier is required for each column of array 12 only if it is necessary to output all bits from an entire row of array 12 simultaneously.

Thus, with this arrangement, within each read cycle one entire row of memory cells are activated and corresponding differential bit lines are charged or discharged accordingly. After a delay period provided by delay unit 32, the sense amplifiers of array 18 are triggered to sense and amplify the differential voltage between a subset of the pairs of bit lines as specified by the column decode decoder.

FIGS. 2 and 3 illustrate suitable SRAM cells 40 and 41, respectively. SRAM cell 40 of FIG. 2 includes a pair of cross-coupled inverters connected between a power supply and ground. Each inverter includes a P-channel device and a N-channel device. Output nodes of the cross-coupled inverters are connected through N-channel pass gate devices 42 and 43 to respective bit lines 24 and 26. A word line 22 is connected to the gates of the N-channel pass devices. With this arrangement, when the word line is pulled high, the cross-coupled inverters begin to discharge one of the two bit lines creating the aforementioned voltage differential.

The SRAM cell 41 of FIG. 3 is similar to that of FIG. 2 but, rather than including a pair of P-channel devices, a pair of highly resistive loads are employed. SRAM cell 41 operates in the same manner as that of FIG. 2. The use of resistors, rather than P-channel devices, allows the SRAM cell to be configured with a somewhat smaller size. On the other hand, because resistors are employed, rather than P-channel devices, a greater quiescent current is drawn. In either embodiment, during operation, one of the N-channel pass devices 44 or 45 or alternatively pass devices 42 or 43 draws a current of I from the bit line connected thereto whereas the other N-channel pass device draws no current. The current drawn through one of the N-channel devices allows current discharge from the corresponding bit line thereby causing a drop in the voltage of the corresponding bit line.

FIG. 4 illustrates a suitable sense amplifier 30. Sense amplifier 30 has a bistable element embodied by a pair of P-channel devices 52 and 54 and a pair of N-channel devices 56 and 58. Sources of the N-channel devices are tied to a node 60 and driven by sense amplifier enable line 36 through an inverter 62. Sources of the P-channel devices are connected to a positive power supply with respect to ground. Output nodes 64 and 66 of the bistable element are coupled to differential bit lines 24 and 26, respectively, through P-channel pass gates 76 and 78 and drive output lines 68 and 70 through inverters 72 and 74, respectively. Gates of P-channel devices 76 and 78 are and comprise a column select line 80 connected to the column decoder. Figure illustrates the case in which the sense amplifier can be coupled to only a single column. In the general case, a sense amplifier of this type might include multiple pairs of P-channel pass gates in order that it might couple to one of any number of such columns.

With this configuration, node 60 is typically held high by inverter 62 while the sense amplifier enable signal is not active. Accordingly, the bistable element is not activated and no positive feedback occurs within it. Additionally, nodes 64 and 66 are precharged to an equal potential. The precharge elements are not indicated here, but can be implemented in a number of manners. The precharge elements are shut off before the read cycle commences. During this time, a differential between the voltages on the pair of bit lines is developed as a result of operation of one of the SRAM cells of the corresponding column. While the differential voltage is developed, the column select signal is held low, thereby allowing the bit lines to discharge nodes 64 and 66 accordingly. Once a suitable amount of differential voltage is generated, after waiting the aforementioned delay time, the sense amplifier enable signal is switched to high, thereby pulling down node 60 and triggering a race condition between the matched P-channel and N-channel pairs in the bistable element. The race is unequal, however, because of the differential applied to nodes 64 and 66, causing the cross-coupled inverters to quickly reach a state wherein either node 64 is high and node 66 is low or vice versa, depending upon the polarity of the initial differential. In other words, the slight differential between the bit lines is quickly amplified to a rail-to-rail differential between nodes 64 and 66. Inverters 72 and 74 then drive the resulting signals onto corresponding output signals 68 and 70.

Preferably, when the sense amplifier enable signal is activated, the column selection signal is deactivated, thereby decoupling nodes 64 and 66 from bit lines 24 and 26, respectively. Without decoupling, the devices of the bistable element would need to pull down one of the two bit lines from a high voltage to zero. As can be appreciated, within large memory arrays wherein the bit lines are coupled to a large number of memory cells, the capacitance on the bit lines, and therefore, on nodes 64 and 66, is significant. Accordingly, it would be difficult for the bistable element to quickly pull down the voltage on one of the bit lines. By decoupling nodes 64 and 66 from the bit lines, however, the bistable element is thereby decoupled from the bit lines and can operate much more quickly. On the other hand, by decoupling the cross-coupled inverters from the bit lines, the cross-coupled inverters become more vulnerable to noise, such as alpha strikes. In other words, once decoupled, the only noise immunity of the cross-coupled inverters is provided by the capacitance of the components of the sense amplifier which is relatively small. Accordingly, an alpha strike, as mentioned above, can cause a reversal in polarity of the differential obtained on nodes 64 and 66 resulting in an erroneous sense amplifier output signal sense amplifier to output an erroneous signal. Hence, deactivation of the column select signal is delayed beyond the activation of the sense amplifier enable signal by an amount of time sufficient to ensure that an adequate differential is obtained between nodes 64 and 66 before the sense amplifier is activated such that an alpha strike will not cause a change in polarity of those nodes. For a 3-volt circuit, the minimum sufficient voltage differential is typically about 300 millivolts.

Thus, for the sense amplifiers of the type illustrated in FIG. 4, a trade-off occurs between sense amplification speed and reliability. Deactivation of the column decoder is intentionally delayed to help ensure reliability. It would be desirable to provide an improved sense amplification method and apparatus which maintains reliability but allows sense amplification to occur without as long of a delay time.

SUMMARY OF THE INVENTION

In accordance with one aspect of the invention, an improved sense amplifier arrangement is provided for use with a memory cell array having a plurality of memory cells and a delay-triggered differential sense amplifier connected to a pair of differential bit lines. The improved sense amplifier arrangement includes one or more additional "preliminary" sense amplifiers connected to the pair of bit lines each having internal cross-coupled inverters directly coupled to the bit lines. The delay-triggered sense amplifier, in contrast, includes a bistable element which is, in use, substantially decoupled from the bit lines of the memory cells by column decode pass devices.

In one embodiment, each preliminary sense amplifier includes a novel bistable element formed of P-channel and N-channel devices and having output nodes connected directly to the differential bit lines. This bistable sense amplifier differs from other such bistable amplifiers in the manner by which it is activated. This modification permits the activation of the preliminary sense amplifier simultaneous to the activation of the word line or with a well-controlled delay with respect to the activation of the word line. Moreover, the strength of the feedback which is enabled can be matched to the strength of the SRAM cell, thereby permitting a fixed ratio over temperature and process. This fixed ratio determines substantially the initial differential margin which the sense amplifier can reliably amplify. The preliminary sense amplifiers are employed in connection with memory cells also having a pair of N-channel pass devices. For optimal design, the N-channel pass devices of the preliminary sense amplifiers are matched in dimensions and physical implementation to the N-channel pass devices of the SRAM cells. Also, in the exemplary embodiment, a current source is coupled to each of the preliminary sense amplifiers to provide current to the common sources of the N-channel devices of the pair of inverters.

With this arrangement, the novel bistable element of the preliminary sense amplifiers is directly coupled to the bit lines of the SRAM cells and are thereby buffered from noise variations, such as is caused by alpha strikes, by the capacitance of the bit lines which, particularly for large arrays, may be quite significant. Also, because the N-channel devices of the preliminary sense amplifiers are matched to the N-channel devices of the SRAM cells, temperature, manufacturing, and process variations do not significantly affect the drive strength of the preliminary sense amplifier relative to that of the SRAM cell, thereby fixing in a manner independent of temperature or process the immunity of the amplification scheme to polarity reversals due to electrical noise or alpha particular upsets.

In use, the additional sense amplifiers are activated at the same time or shortly after the memory cells are activated. The preliminary sense amplifiers begin to sense and amplify voltage differentials on the bit lines caused by operation of the memory cells while the differentials are still quite small, particularly as compared to the differential required before triggering the delay-triggered sense amplifier. After a suitable delay period, the delay-triggered sense amplifiers are activated to complete amplification of the original voltage differential generated by the memory cells into a rail-to-rail differential suitable for producing output signals. The time delay in triggering the delay-triggered sense amplifiers is selected such that the minimum acceptable voltage differential is achieved on the bit lines to further ensure noise immunity before the delay-triggered sense amplifiers are activated. In one specific embodiment, the activation of the delay-triggered sense amplifiers is delayed until a 300 millivolt differential is achieved within a 3-volt system. However, because the preliminary sense amplifiers provide an initial amount of amplification, the time required to yield the minimum voltage differential is reduced over that of prior art system. Hence, read access speed is improved.

As such, an initial level of sensing and amplification is performed by sense amplifiers that are coupled to large capacitive loads during a time period when the delay-triggered sense amplifier, which lacks adequate capacitive loading, cannot reliably amplify the differential voltage as a result of noise problems and the like. Once the voltage differential has been amplified to a level where noise immunity is no longer a significant concern, the delay-triggered sense amplifiers are triggered thereby quickly amplifying the voltage differential to rail voltages. Hence, the delay-triggered sense amplifier, which has little capacitive coupling, is employed only to perform a final stage of amplification which cannot be performed quickly by the other sense amplifiers which are closely coupled to the large capacitances of the bit lines.

Thus, a two stage amplification technique is employed which allows a differential voltage signal provided by a memory cell to be amplified to usable voltages faster than can typically be achieved using a conventional sense amplifier arrangement having all sense amplifiers substantially decoupled from the bit lines. Two or more stages of the novel sense amplifiers may be provided for sequential operation to further reduce the overall read time from the memory cells.

DETAILED DESCRIPTION OF EXEMPLARY EMBODIMENTS OF THE INVENTION

With reference to the remaining figures, exemplary embodiments of the invention will now be described. The exemplary embodiments are described primarily with reference to block diagrams illustrating apparatus elements. It should be appreciated that not all components necessary for a complete implementation of a practical system are illustrated or described in detail. Rather, only those components necessary for a thorough understanding of the invention are illustrated and described. Furthermore, components which are either conventional or may be readily designed and fabricated in accordance with the teachings provided herein are not described in detail.

Figure 5:
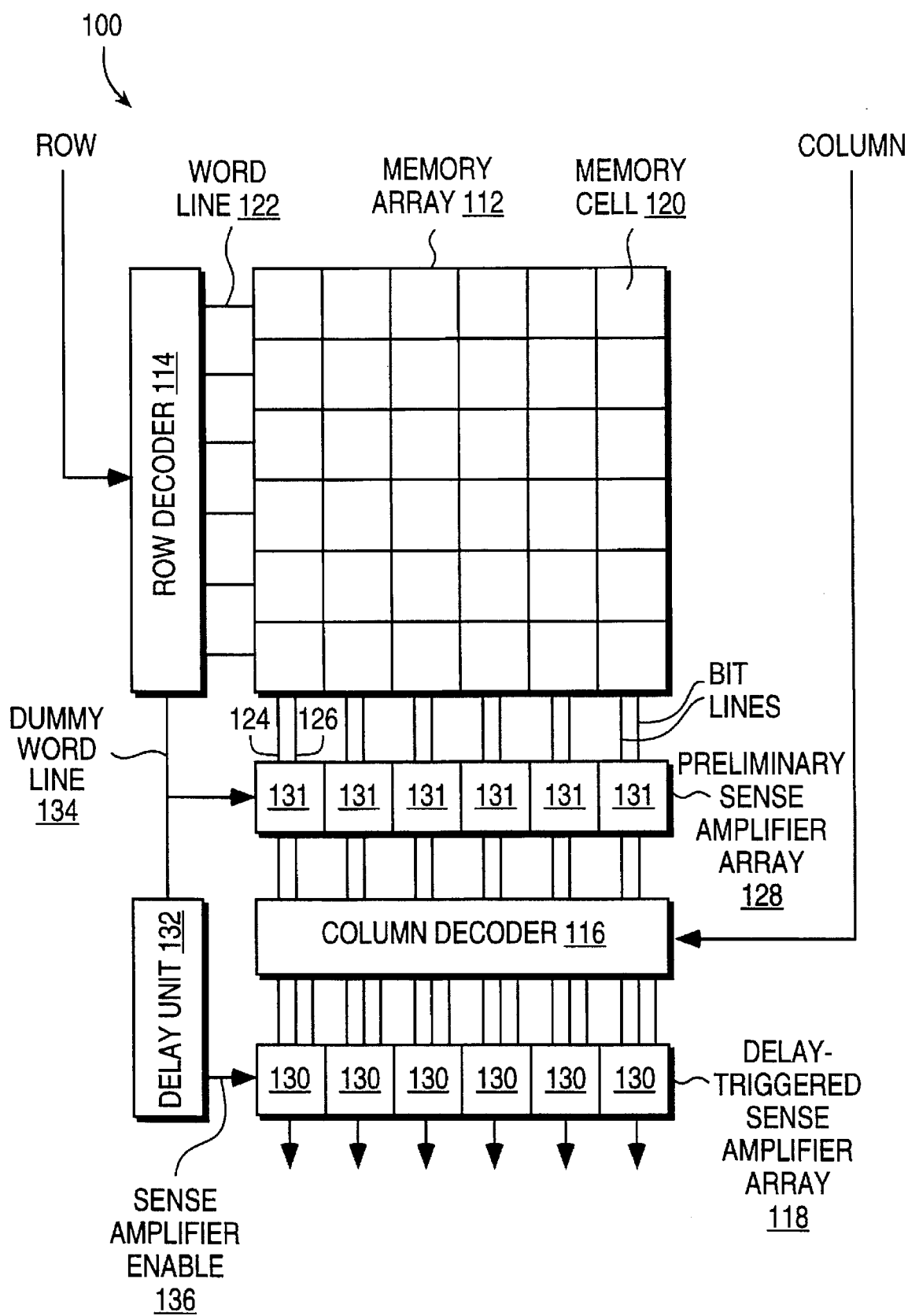
FIG. 5 is a block diagram of a memory array configured in accordance with one embodiment of the present invention.

FIG. 5 illustrates a memory apparatus 100 having an array 112 of SRAM cells 120, a row decoder 114, a column decoder 116 and an array of delay-triggered sense amplifiers 118. Individual SRAM cells of array 112 are denoted by reference numeral 120. Row decoder 114 is connected to individual rows of array 112 by individual word lines 122. A pair of differential bit lines 124 and 126 interconnect each column of SRAM cells of array 112. Bit lines 124 and 126 are coupled to delay-triggered sense amplifier array 118 through the column decoder 116 and are coupled to a secondary sense amplifier array 128. Individual sense amplifiers of array 118 are denoted by reference numeral 130 and individual sense amplifiers of array 128 are denoted by reference numeral 131. As will be described more fully below, sense amplifiers 130 are, effectively decoupled from bit lines 124 and 126 during use. Sense amplifiers 131 of preliminary array 128 are, directly coupled to bit lines 124 and 126. Sense amplifiers 131 begin to sense and amplify signals on the bit lines either simultaneous to, or shortly after, the activation of the SRAM cells of array 112. The large capacitance on the bit lines, caused by interconnection of the bit lines to all of the SRAM cells of a column of array 112, substantially prevents spurious noise from reversing the polarity of the differential voltage between the bit lines as sense amplifiers 131 amplify the signal.

Thereafter, following a delay time generated by delay unit 132, sense amplifiers 130 and delay-triggered array 118 are activated. Upon activation, sense amplifiers 130 initially sense the differential voltage on the bit lines (which has already been amplified somewhat by sense amplifiers 131). Then, sense amplifiers 130 are decoupled from the bit lines, to allow quick amplification of the sense differential voltage to corresponding rail voltages. Thus, an initial level of amplification is provided by sense amplifiers 131, then additional amplification is perform by sense amplifiers 130. The two levels of amplification allow the differential voltage to be sensed and amplified quickly. In this regard, the delay time provided by delay unit 132 may be significantly less than the delay that must be provided by corresponding delay units of conventional sense amplifier arrangements.

The operation of sense amplifiers 131 are triggered by a dummy word line signal provided along a line 134 from row decoder 114. The dummy word line signal may be delayed slightly from the word line signals provided to the SRAM cells of array 112 or it may be asserted at the same instant. The word line signal is also routed through delay unit 132 which generates a sense amplifier enable signal 136 for transmission to sense amplifiers 130. Delay unit 132 may be configured in accordance with a variety of techniques to provide a suitable delay. In one particular implementation, delay unit 132 is composed of a set of dummy SRAM cells forming a dummy word line or from a set of dummy SRAM cells forming a dummy bit line, or both. By employing dummy memory cells, the amount of delay generated therethrough can be matched to delays occurring within the SRAM cells of array 112 to thereby limit any skew variation caused by temperature, manufacturing or process variations. The aforementioned dummy word line which triggers operation of the preliminary sense amplifiers may be based, in part, on signals routed through a portion of the delay unit. However, the delay between the dummy word line and the word line signal is either zero or is significantly less than the delay between the sense amplifier enable signal and the word line signal to activate the preliminary sense amplifiers well in advance of the delay-triggered sense amplifiers.

Figure 1:
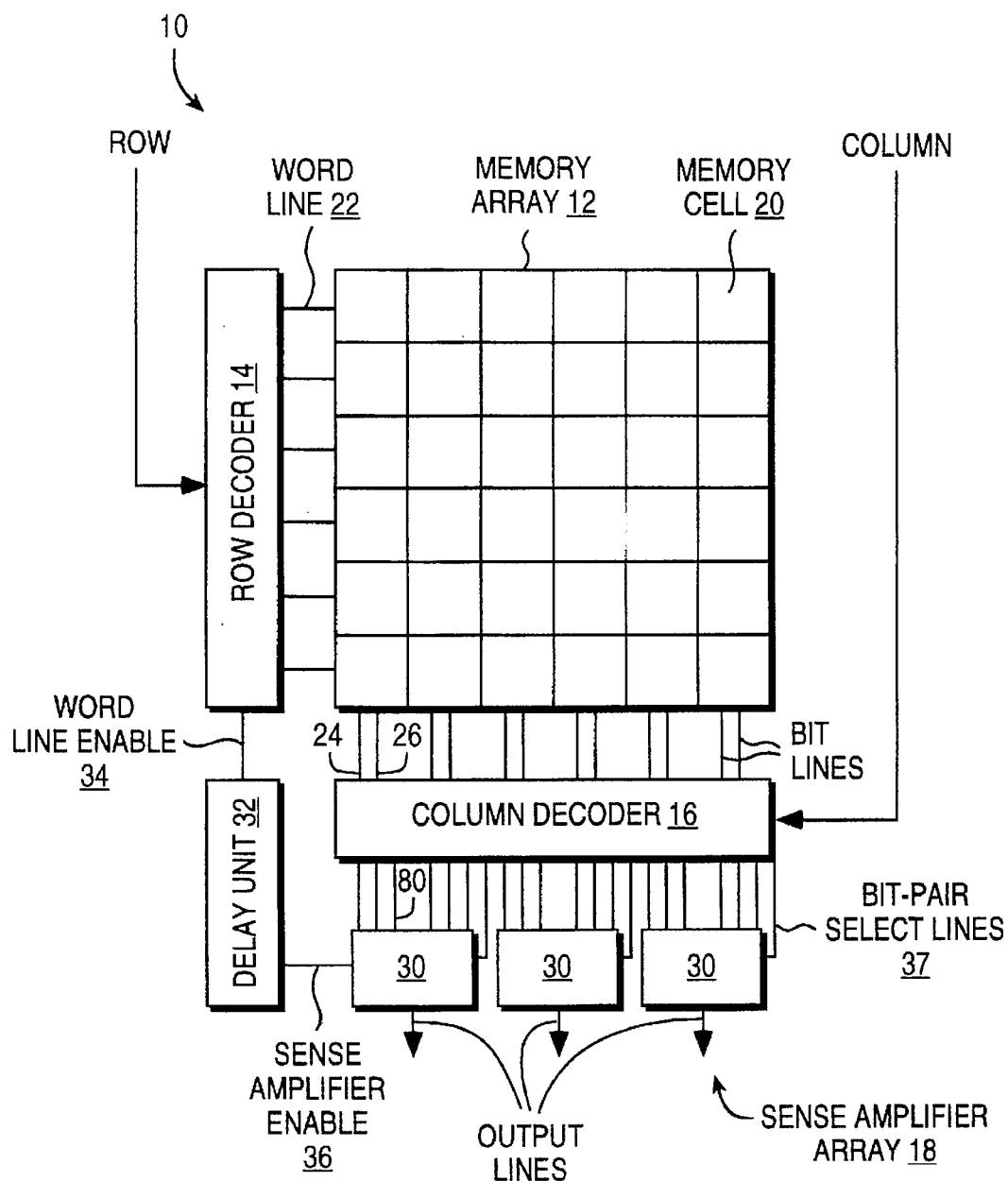
FIG. 1 is a block diagram of a differential voltage memory array configured in accordance with the prior art.

Array 112, row decoder 114, column decoder 116, delay-triggered sense amplifier array 118 and delay unit 132 may be similar to corresponding components of the embodiment of FIG. 1. As such, the operation and configuration of these components will not be described in further detail.

Figure 6:
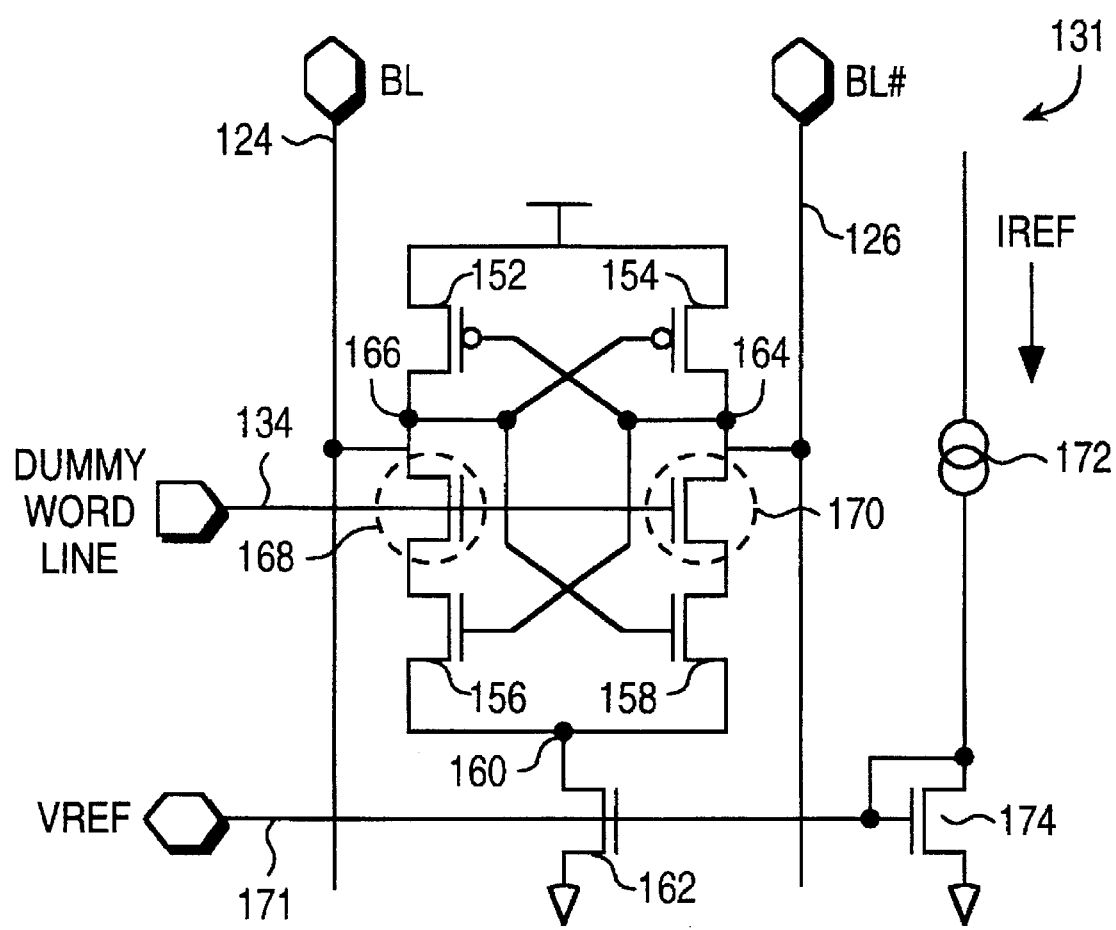
FIG. 6 is a circuit schematic of a sense amplifier for use with the circuit schematic of FIG. 5.

FIG. 6 illustrates an exemplary arrangement for one of the preliminary sense amplifiers 131 of secondary array 128. More specifically, FIG. 6 illustrates a novel bistable element formed from a pair of P-channel devices 152 and 154 and a pair of N-channel devices 156 and 158. Sources of the P-channel devices are connected to a high power supply. Sources of the N-channel devices are coupled to a node 160 which is, in turn, connected through an additional N-channel device 162 to a ground. Alternatively, node 160 may itself be grounded. Gates of N-channel devices 152 and 154 are cross-coupled to output nodes 164 and 166, respectively. Nodes 164 and 166 are, in turn, coupled to bit lines 126 and 124, respectively. Gates of N-channel devices 156 and 158 are cross-coupled, respectively, to nodes 164 and 166.

Figure 2:
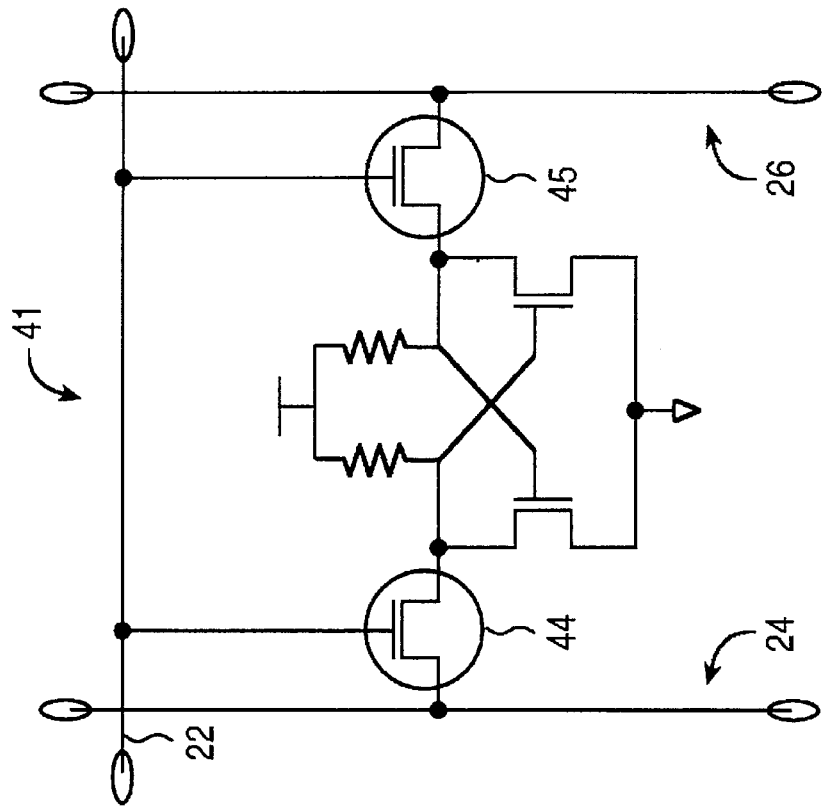
FIG. 2 is a circuit schematic of a memory cell of the memory array of FIG. 1.
Figure 3:
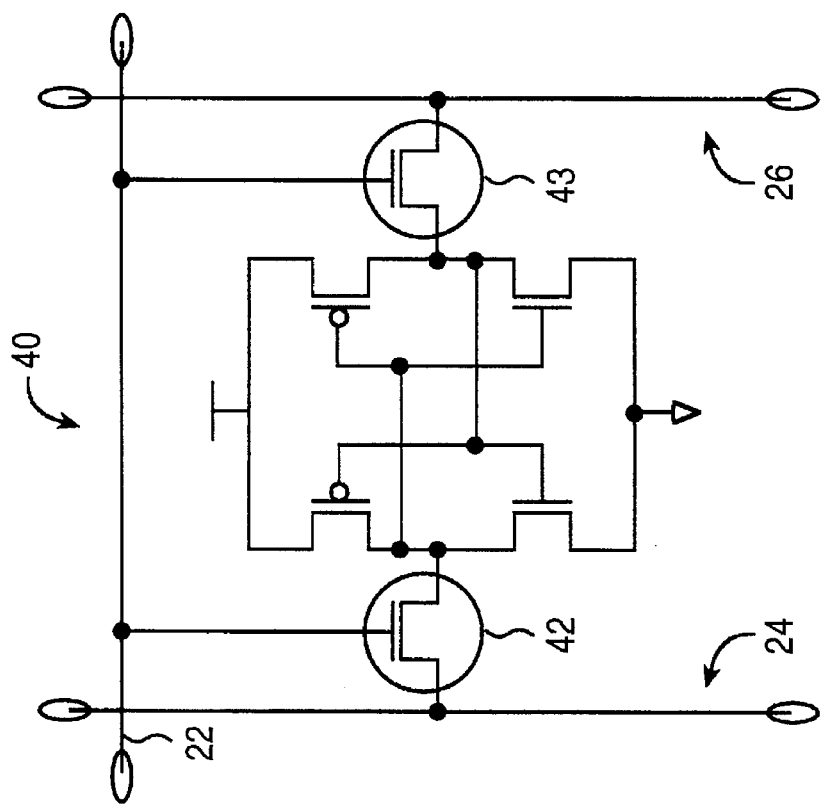
FIG. 3 is a circuit schematic of an alternative memory array of the memory cell of FIG. 1.
Figure 4:
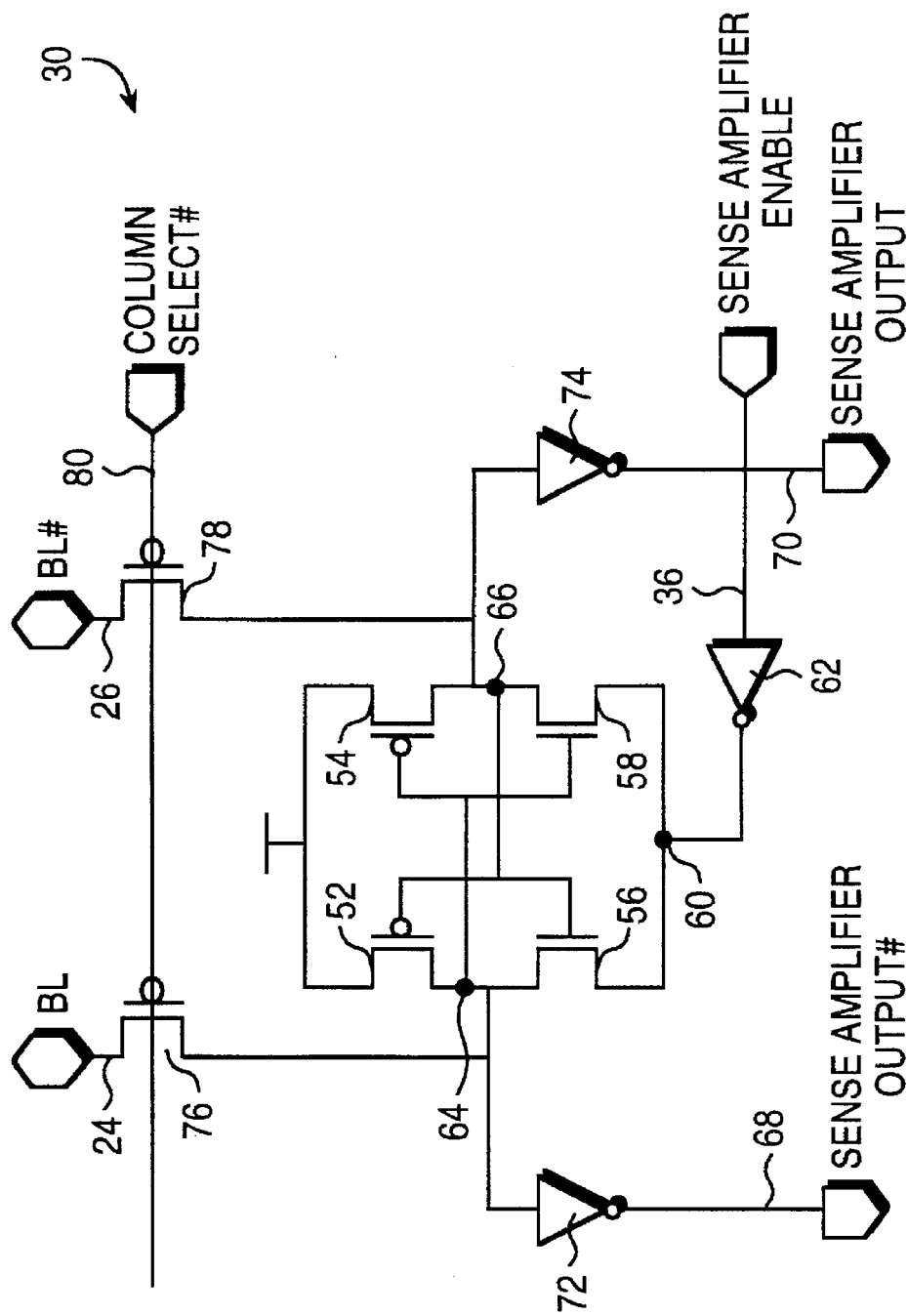
FIG. 4 is a circuit schematic of a sense amplifier for use in the memory array of FIG. 1.

Sense amplifiers 131 additionally includes two N-channel pass transistors 168 and 170. N-channel device 168 is connected between node 166 and N-channel device 156. Likewise, N-channel device 170 is connected between node 164 and N-channel device 158. With this arrangement, N-channel pass devices 168 and 170 limit the capability of the cross-coupled inverters to pull down voltages on the corresponding bit lines. N-channel devices 168 and 170 are preferably matched in size and layout to N-channel devices of the SRAM cells of array 112 (FIG. 5). Suitable SRAM cells for use within array 112 are illustrated in FIGS. 2 and 3. The corresponding N-channel pass devices of the SRAM cells of FIGS. 2 and 3 are identified therein by reference numerals 42 and 43, and 44 and 45, respectively. By matching the N-channel pass devices 168 and 170 of sense amplifiers 131 with the N-channel pass devices of the SRAM cells, differential skew caused by supply voltage temperature, manufacturing and process variations, is substantially avoided. Gates of the N-channel pass devices 168 and 170 of sense and amplifier 31 are connected to the dummy word line 134 to allow the sense amplifier to be activated shortly after the SRAM cells of the array are activated.

In addition to the components thus far described, sense amplifier 131 also includes a voltage reference (VREF) line 171, a current reference source 172 and an N-channel current mirror device 174. Gates of N-channel devices 162 and 174 are both connected to voltage reference 171 in addition to being connected directly to the current reference source 172. With this arrangement, in use, current provided by reference source 172 is mirrored in N-channel devices 162 allowing the bistable element to pull down either bit line 124 or bit line 126 thereby developing a differential voltage.

The operation of sense amplifier 131 will now be described more fully. Initially, bit lines 124 and 126 are precharged to a high voltage level by precharge devices (not shown). Dummy word line 134 is inactive and node 160 is thereby held to a low voltage value. No current is sunk into device 162 because devices 168 and 170 are not in a conductive state. A small current is drawn only through device 174 as it continues to bias the sense amplifier.

To initiate a read operation, the word line is pulled high thereby causing one of the SRAM cells of the corresponding column to activate which, as noted above with reference to FIGS. 2 and 3, causes one of the bit lines to begin to discharge slightly. The bit line which begins to discharge depends, of course, upon binary values stored within the corresponding SRAM cell. At the same time or shortly thereafter, the dummy word line 134 is pulled high, thereby opening N-channel pass devices 168 and 170 and allowing current to be sunk into device 162 which gate is biased so as to act as a nearly ideal current sink. If device 162 sinks a current of I and the bit lines commence at an identical voltage, then initially a current of I/2 is drawn through N-channel devices 156 and 158. The initially slight differential between bit lines 124 and 126 developed by the SRAM cell activated within the given column causes an imbalance in the bistable element of sense amplifier 131 resulting in more currently drawn through one of N-channel devices 156 and 158 than the other. For example, after some period of time, N-channel device 156 may draw only ¼ I and N-channel device 158 may draw ¾ I. (It should be noted that, despite the imbalance within the cross-coupled inverters, N-channel device 174 continues to sink a constant current and N-channel device 162 sinks very nearly the same current since it is biased to be in saturation.)

Eventually, the imbalance between the cross-coupled inverters increases until zero current is drawn through N-channel device 156 and I current is drawn through N-channel device 158 causing bit line 126 to be discharged significantly whereas bit line 124 is discharged only slightly or not at all. Simultaneously, the N-channel pass devices of the SRAM cell that has been activated also draw current. More specifically, one of the N-channel devices (corresponding to the bit line to be pulled down) draws a current of approximately I whereas the other N-channel device draws a current of 0. Hence, the total current drawn from the bit line being discharged quickly reaches 2I whereas the current drawn from the bit line not being discharged remains 0. As such, a current of 2I is drawn from one of the bit lines, rather than only I as with the memory array of FIGS. 1–4. Since twice the current is drawn, the differential is amplified about twice as fast as the unamplified devices of the prior art wherein only the SRAM cell operates to create a differential prior to triggering of the delay-triggered sense amplifiers.

Thus, secondary sense amplifier 131 is activated either at the same time or shortly after activation of the SRAM cell and operates to amplify the voltage differential created by the SRAM cell. After a suitable time delay also, the delay-triggered sense amplifier is also activated, causing further amplification of the resulting differential. The initial amplification generated by sense amplifier 131 is subject to the large capacitance of bit lines 124 and 126 and is thereby substantially immune from noise problems, such as alpha strike problems. Despite the large capacitance, significant amplification of the voltage differential occurs as a result of the above-described doubling of current. When the delay-triggered sense amplifier 130 is triggered, the delay-triggered sense amplifier may be decoupled from the bit lines thereby allowing the remaining amplification to rail voltages to proceed quickly without significant capacitive loading.

As noted above, the N-channel pass devices of sense amplifier 131 should be closely matched to N-channel pass device of the SRAM cells in order that the drive strength of the novel sense amplifier may be matched well to that of the SRAM cell. If not properly matched, erroneous output can occur. For example, if the sense amplifier 131 is activated before the SRAM cell, the sense amplifier may amplify a residual voltage differential on the bit lines to an amount which overcomes the subsequent differential generated by the SRAM cell. Hence, careful matching of the word lines enabling sense amplifier 131 and the SRAM cells should be employed. Conventional matching techniques are adequate.

Figure 7:
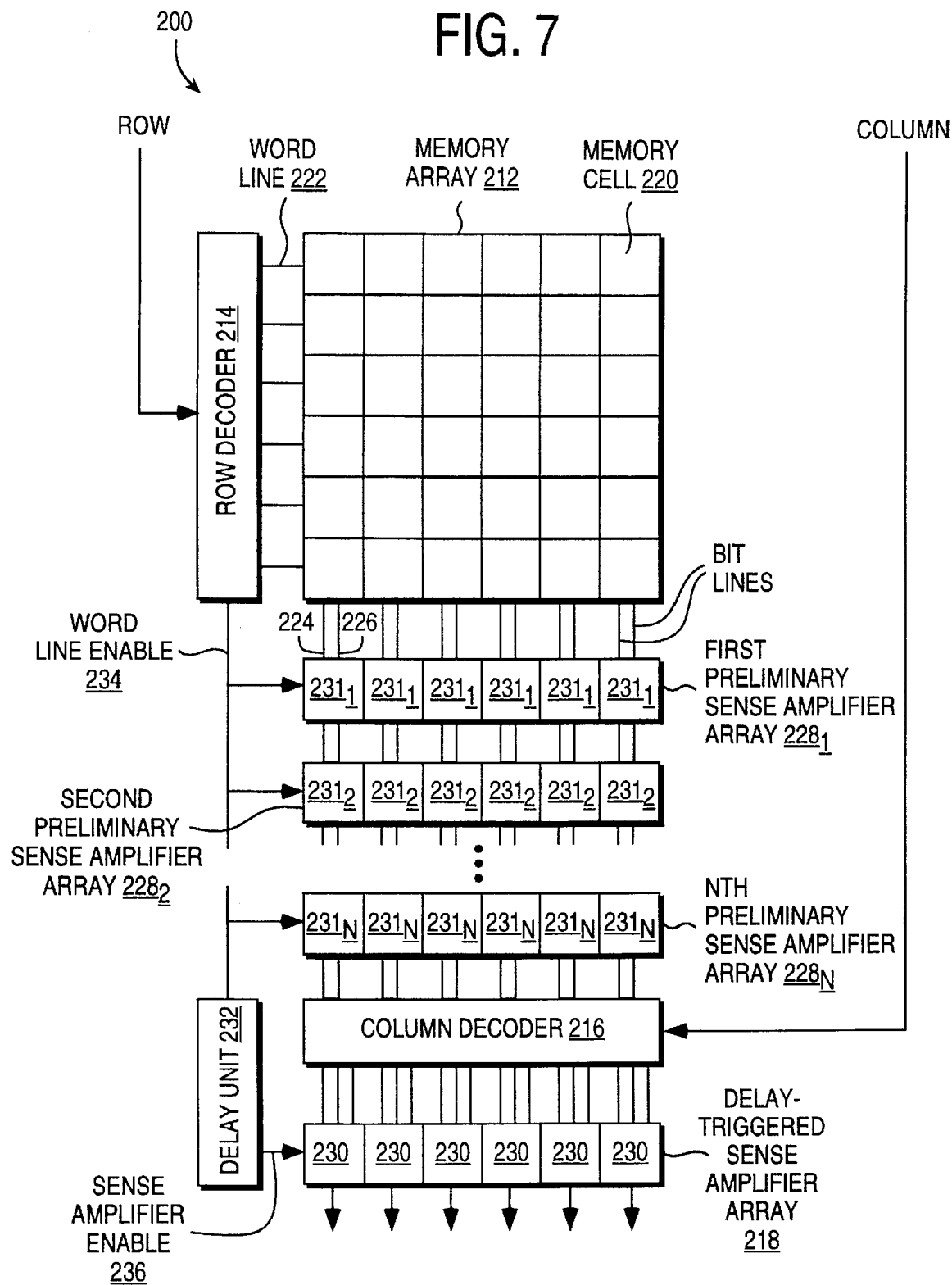
FIG. 7 is a block diagram of an alternative embodiment of the present invention.

FIG. 7 illustrates an alternative memory array having an entire set of secondary sense amplifiers triggered sequentially upon activation of corresponding SRAM cells to provide successive preliminary stages of amplification prior to the amplification provided by a conventional delay-triggered sense amplifier. The memory apparatus of FIG. 7 is similar to that of FIG. 5 and like components are represented with like reference numerals incremented by 100. Only relevant differences between the embodiments will be described. Whereas the memory apparatus of FIG. 5 includes a single stage of secondary sense amplifiers 130, the apparatus of FIG. 7 includes a set of N secondary sense amplifier arrays $230_1$–$230_N$. Each of the secondary sense amplifier arrays includes a set of individual sense amplifiers identified by reference numerals $131_1$–$131_N$. With this arrangement, an entire column of N secondary sense amplifiers are connected to each pair of bit lines along with the single delay-triggered sense amplifier. Each individual sense amplifier may be configured in accordance with the arrangement of FIG. 6. However, sizes of the P-channel and N-channel devices of the cross-coupled inverters may differ from one stage to another to provide for suggestively increasing amounts of amplification of the voltage differential on the bit lines. In each case, however, the N-channel pass devices of the sense amplifiers are all matched to the corresponding N-channel pass devices of the SRAM cells.

With this arrangement, multiple stages of preliminary amplification of the voltage differential is performed, prior to triggering of the delay-triggered sense amplifiers. As such, even faster preliminary amplification is achieved, allowing an even further reduction in the delay period necessary prior to triggering of the delay-triggered sense amplifiers. As such, the overall time necessary for performing a read operation is correspondingly decreased.

Also, as noted, the sense amplifiers of the secondary arrays can be configured to trigger sequentially to provide successively increasing amounts of amplification. This may be achieved by providing a slight time delay in the dummy word lines connected to successive secondary stages. Alternatively, sequential operation may be achieved merely by selecting appropriate sizes for the common source N-channel devices 156 and 158 of the bistable element or the N-channel device 162 which substantially establishes the current through these two devices.

As noted above, for an embodiment having one stage of secondary sense amplifiers, a total current of approximately 2I will be drawn during the initial amplification stage. By providing N stages of secondary sense amplifiers, a total current of approximately NI may be drawn. The additional current allows the bit lines to be discharged proportionally faster to thereby achieve the aforementioned faster preliminary amplification.

In general, any number of stages of secondary sense amplifiers may be provided. In practical implementations, it may be desirable to employ only two or three secondary sense amplifier stages as the presence of additional stages may not provide a sufficient further increase in amplification speed to justify the increase silicon resources required to implement the additional amplification stages. Moreover, increasing the number of stages excessively will increase the loading on the bit line and elsewhere so as to potentially slow down operation of the circuit. A specific embodiment having two secondary sense amplification stages is set forth in detail within circuit schematics incorporated within an Appendix attached hereto and incorporated by reference herein. The Appendix provides a specific example of a memory apparatus having two secondary sense amplification arrays in combination with a "large" array of SRAM cells having an arbitrary number of SRAM cells per column. The Appendix also includes a separate schematic showing the delay-triggered sense amplifier and precharge circuitry for use with the large array.

Figure 8:
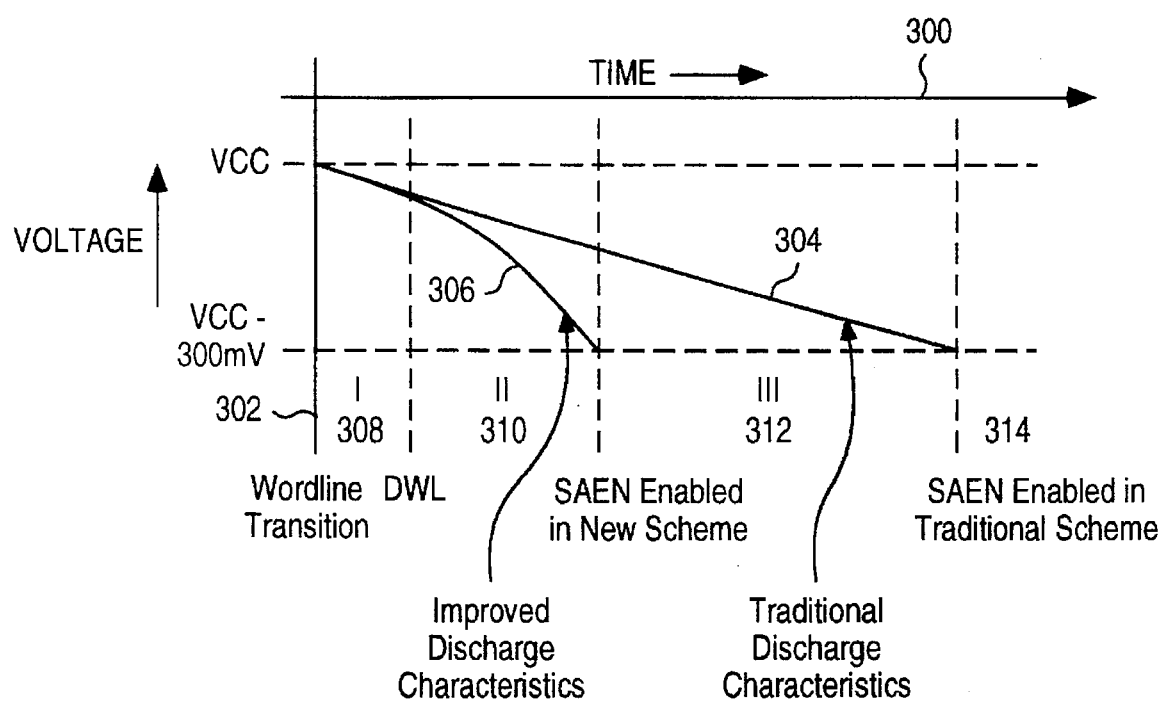
FIG. 8 is a graph illustrating differential voltage amplification for the memory array of FIG. 5 as compared to the memory array of FIG. 1.

Thus, various embodiments of a memory apparatus have been described which employ one or more primary stages or sense amplifiers to achieve enhanced overall read access time over a memory apparatus having only a delay-triggered arrays of sense amplifiers which are triggered only after a minimum delay period has elapsed. FIG. 8 is a graph illustrating a comparison of a memory apparatus having two primary sense amplifier stages in combination with a single primary stage as compared to the memory apparatus having only a single primary stage. More specifically, FIG. 8 illustrates voltage 300 of an exemplary bit line as a function of time 302. The voltage on the bit line for a conventional memory apparatus is represented by curve 304. Voltage on the bit line for a memory apparatus having two secondary stages of amplification is represented by curve 306. As can be seen, the voltage on the bit line represented by curve 306 decreases much faster than that of curve 304 indicating a faster amplification of a voltage differential between the bit line being pulled down and the voltage of the bit line not being pulled down (not separately shown). FIG. 8 also illustrates three time periods. A first time period 308 begins when the respective word lines are enabled triggering activation of the SRAM cells. A subsequent time period 310 begins with activation of the dummy word line which triggers activation of the secondary sense amplifiers. Time periods 308 and 310 may begin simultaneously if the dummy word line is matched in a one-to-one ratio with the word line. Voltages for curves 304 and 306 both decrease by equal amounts during time period 308 as a result of operation of the SRAM cell. During time period 310, the voltage of curve 306 decreases much faster as a result of the operation of the secondary amplification stages working in combination with the SRAM cell. The voltage of curve 304 continues to decrease gradually as a result of continued operation of the SRAM cell. By the end of time period 310, the voltage of curve 306 has decreased by 300 millivolts— an amount sufficient to allow triggering of the delay-triggered sense amplification stage. For curve 304, the voltage does not decrease by 300 millivolts until time period 314. As such, the read time reduction of the memory apparatus of the invention will be equal to the time difference between the end of time period 312 and the end of time period 314. Actual time differences depend, of course, upon numerous factors including the relative sizes of various components, temperature, voltage, process and manufacturing variations. Accordingly, absolute time savings may vary from embodiment to embodiment. Moreover, the proportional time savings may vary as well from embodiment to embodiment.

What has been described are various embodiments of a memory apparatus having at least one preliminary sense amplification stage for use in initiating amplification of a differential voltage signal provided by SRAM cell prior to triggering of a time delayed delay-triggered sense amplifier. The embodiments described herein are intended to merely illustrate principles of the invention and should not be construed as limiting the scope of the invention. Rather, principles of the invention may be applied to a wide range of other embodiments as well, perhaps including non-memory apparatus embodiments.

I claim:

1. A sense amplifier for use within a memory array having a pair of differential bit lines, said sense amplifier comprising:

a pair of cross-coupled inverters connected between a power supply and a ground and having a pair of output nodes for direct connection to the differential bit lines;

a pair of N-channel pass devices connected between N-channel devices of the cross-coupled inverters and the output nodes; and a current source coupled to an additional N-channel device connected between the N-channel devices of the cross-coupled inverters and the ground.

2. A sense amplifier for connection to a pair of first and second differential bit lines, said sense amplifier comprising:

first and second P-channel devices having sources connected to a power supply, drains connected to an output node connected to respective bit lines and gates connected to the output node of the opposite bit line;

a pair of first and second N-channel devices having sources connected through a third N-channel device to a ground and having gates connected to the output node associated with the opposite bit line; and fourth and fifth N-channel devices having sources connected to drains of the first and second N-channel devices, respectively, having drains connected to the output node associated with the respective bit line, and having gates mutually connected to an input signal line; and a constant current reference source connected to the gate of the third N-channel device; and a sixth N-channel device having a source and a gate both connected to the current source and having a drain connected to a ground.

3. A circuit for sensing and amplifying a differential voltage provided by a memory cell on a pair of bit lines, the memory cell being selected by a row decoder and a column decoder from an array of memory cells, the circuit comprising:

a preliminary stage sense amplifier coupled to the bit lines that senses and amplifies the differential voltage responsive to a word line signal provided by the row decoder, the preliminary stage sense amplifier outputting an initially amplified differential voltage to the column decoder;

a delay unit coupled to the row decoder that generates an enable signal which is delayed with respect to the word line signal by a delay time;

a final stage sense amplifier coupled to receive the initially amplified differential voltage from the preliminary stage sense amplifier via the column decoder, the final stage sense amplifier also being coupled to the delay unit to further amplify the initially amplified differential voltage responsive to the enable signal.

4. The circuit of claim 3 wherein the final stage sense amplifier is decoupled from the bit lines following the delay time.

5. The circuit of claim 3 wherein the delay unit comprises a set of dummy memory cells forming a dummy word line that provides the enable signal.

6. The circuit of claim 5 wherein the delay time matches a characteristic delay of the word line signal.

7. The circuit of claim 3 further comprising an intermediate stage sense amplifier interposed between the preliminary stage sense amplifier and the column decoder, the intermediate stage sense amplifier further amplifying the initially amplified differential voltage.

\* \* \* \* \*

UNITED STATES PATENT AND TRADEMARK OFFICE
CERTIFICATE OF CORRECTION

PATENT NO. : 5,627,789
DATED : May 6, 1997
INVENTOR(S) : Jeffrey C. Kalb, Jr.

It is certified that error appears in the above-identified patent and that said Letters Patent is hereby corrected as shown below:

In column 3 at line 38 insert --signal-- following "enable" and prior to "34"

In column 4 at line 15 delete "decode decoder." and insert --decoder.--

In column 4 at line 38 delete "of"

In column 5 at lines 44-45 delete "sense amplifier to output an erroneous signal"

In column 6 at line 65 delete "system." and insert --systems.--

In column 9 at line 29 delete "and amplifier 31" and insert --amplifier 131"

Signed and Sealed this

Eleventh Day of November, 1997

BRUCE LEHMAN

*Attest:*

*Attesting Officer*   Commissioner of Patents and Trademarks